United States Patent [19]
Baba et al.

[11] Patent Number: 5,528,198
[45] Date of Patent: Jun. 18, 1996

[54] CLOCK SIGNAL EXTRACTION APPARATUS USING VCO HAVING PLURALITY OF SELECTABLE PHASE SHIFTED OUTPUTS

[75] Inventors: Mitsuo Baba; Yasushi Aoki, both of Tokyo, Japan

[73] Assignee: NEC Corporation, Tokyo, Japan

[21] Appl. No.: 458,074

[22] Filed: Jun. 1, 1995

[30] Foreign Application Priority Data

Jun. 15, 1994 [JP] Japan ..................... 6-132767

[51] Int. Cl.⁶ ................. H03L 7/087; H03L 7/099
[52] U.S. Cl. ............... 331/1 A; 331/11; 331/14; 331/17; 331/25
[58] Field of Search ............... 331/1 A, 11, 14, 331/17, 25

[56] References Cited

U.S. PATENT DOCUMENTS

| | | | |
|---|---|---|---|
| 4,584,695 | 4/1986 | Wong et al. | 375/81 |
| 5,068,628 | 11/1991 | Ghoshal | 331/11 |
| 5,126,691 | 6/1992 | Mijuskovic et al. | 331/1 A |
| 5,157,355 | 10/1992 | Shikakura et al. | 331/11 |

FOREIGN PATENT DOCUMENTS 0516379 12/1992 European Pat. Off. .
63-296589 12/1988 Japan .
1-129530 5/1989 Japan .

OTHER PUBLICATIONS

"Analog PLL with Quick Phase Lock", IBM Technical Disclosure Bulletin, Sep. 1991, vol. 34, No. 4B, pp. 468–473.

*Primary Examiner*—Siegfried H. Grimm
*Attorney, Agent, or Firm*—Young & Thompson

[57] ABSTRACT

A plurality of clock signals at an identical frequency but with different phases are oscillated by a voltage-controlled oscillator beforehand, and selection is made of one of the clock signals whose phase is closest to that of the data signal each time the data signal rises. In parallel with the selection of phase, a phase/frequency comparison is made between any one of the clock signals output from the voltage-controlled oscillator and the selected clock signal. After the comparison, the oscillation frequency of the voltage-controlled oscillator is converted for their matching. This matching allows acquisition of a clock signal with the closest phase immediately after arrival of the data signal, and acquisition of an extraction clock signal with the frequency and phase matched in a short time by parallel conversion of the oscillation frequency of the voltage-controlled oscillator.

24 Claims, 11 Drawing Sheets

| RISING TIMING OF DATA SIGNALS | OUTPUT STATE OF FLIP-FLOP CIRCUIT | FIRST CONVERSION VALUES | ENCODED DATA | CORRESPONDING CLOCK SIGNALS |
|---|---|---|---|---|
| $T_{11}$ | 1001 | 1000 | 11 | FIRST CLOCK SIGNAL |
| $T_{12}$ | 1100 | 0100 | 10 | SECOND CLOCK SIGNAL |
| $T_{13}$ | 0110 | 0010 | 01 | THIRD CLOCK SIGNAL |
| $T_{14}$ | 0011 | 0001 | 00 | FOURTH CLOCK SIGNAL |

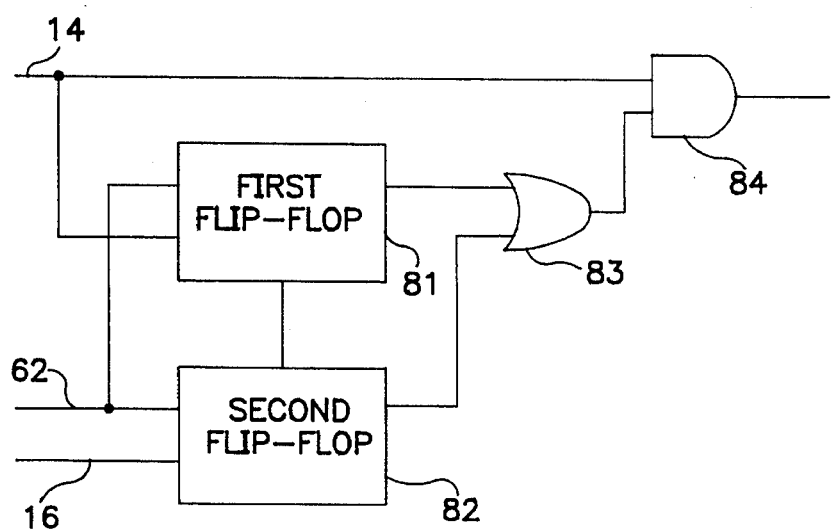
FIG. 8
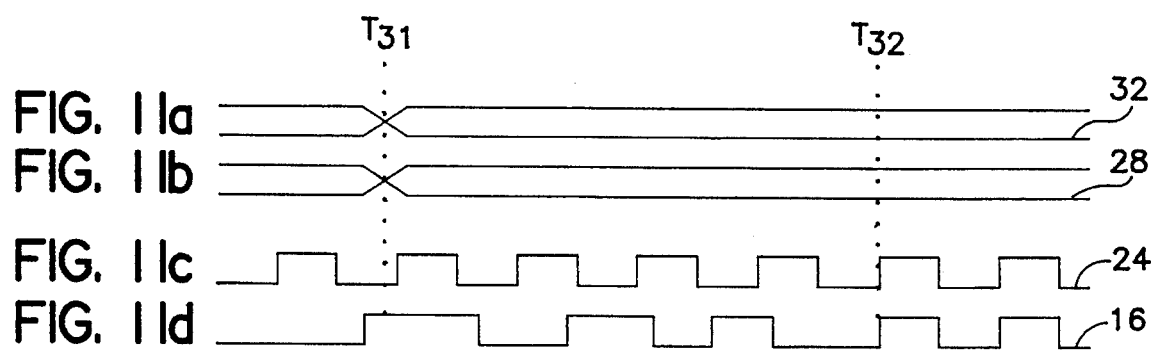
FIG. 11a
FIG. 11b
FIG. 11c
FIG. 11d

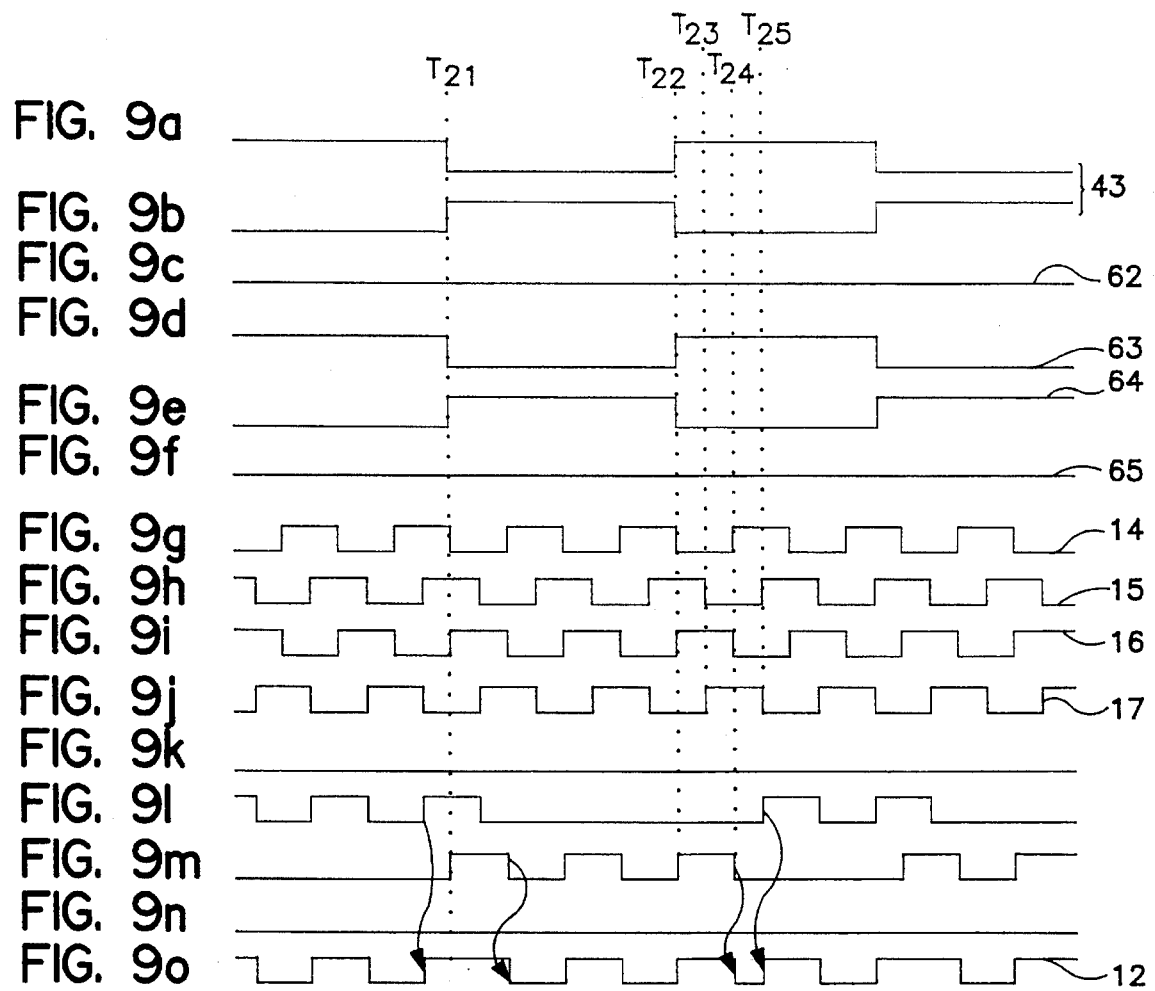

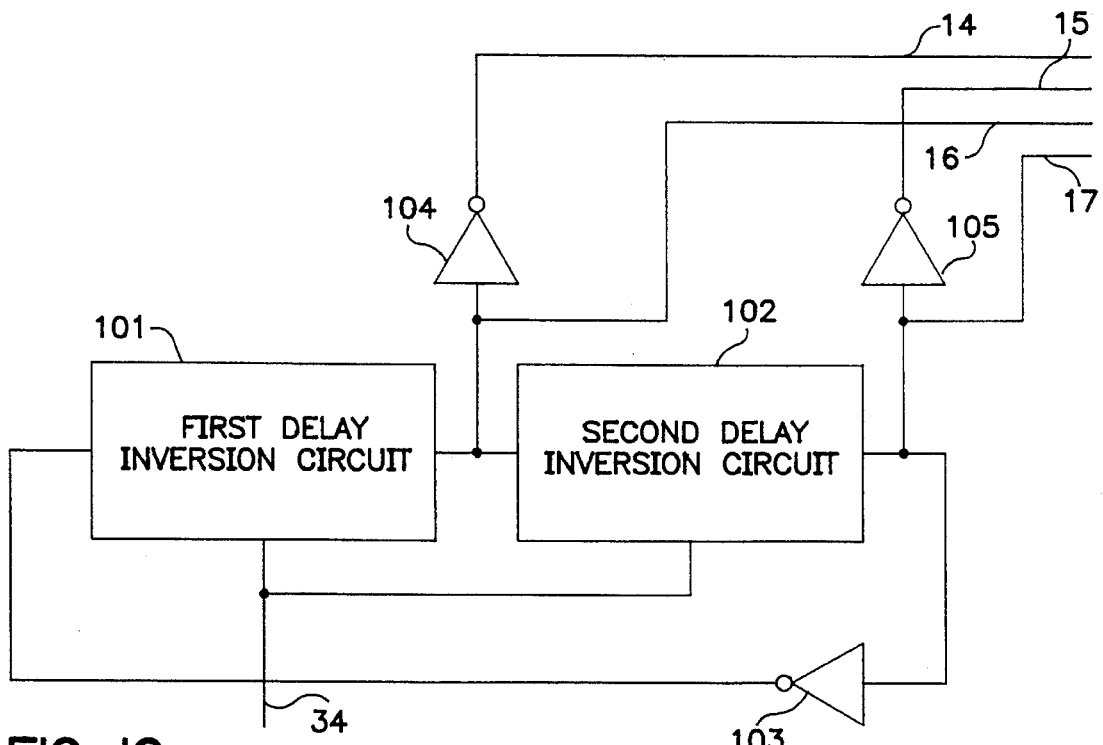
FIG. 10
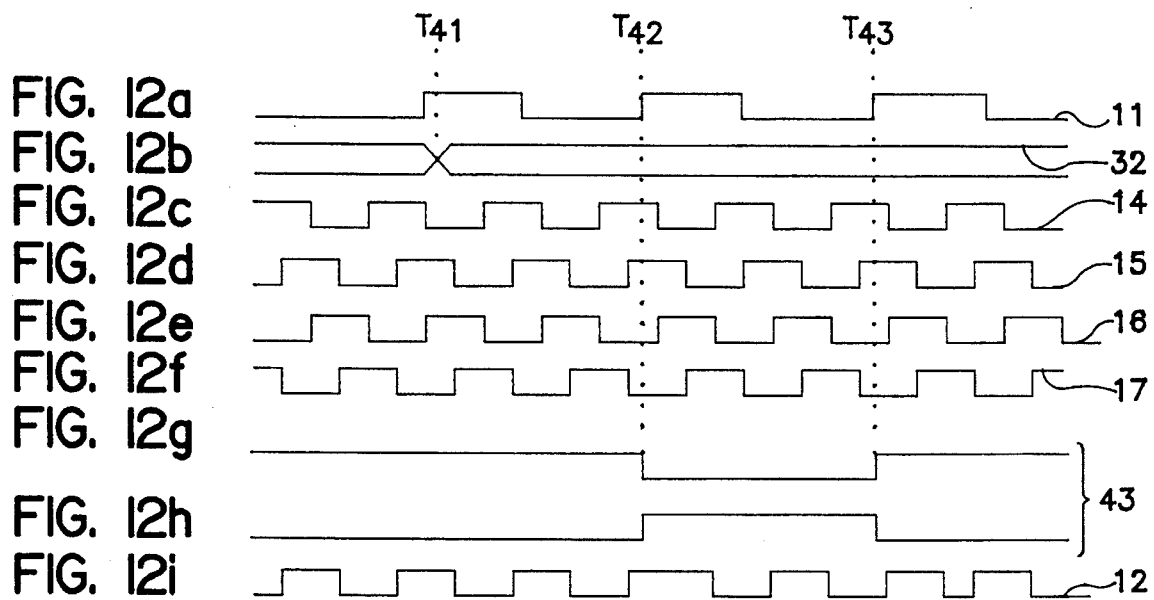
FIG. 12a
FIG. 12b
FIG. 12c
FIG. 12d
FIG. 12e
FIG. 12f
FIG. 12g
FIG. 12h
FIG. 12i

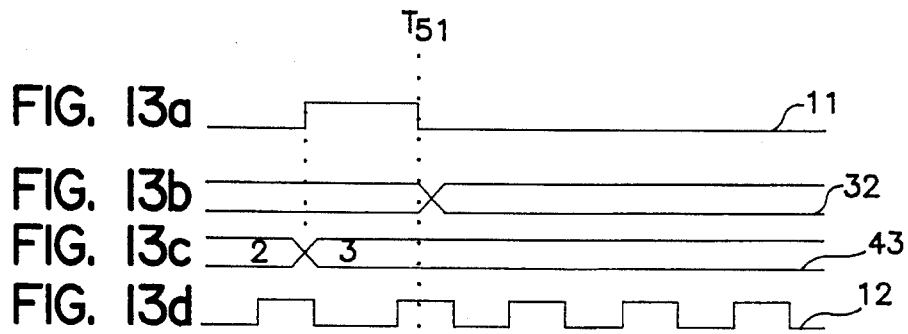
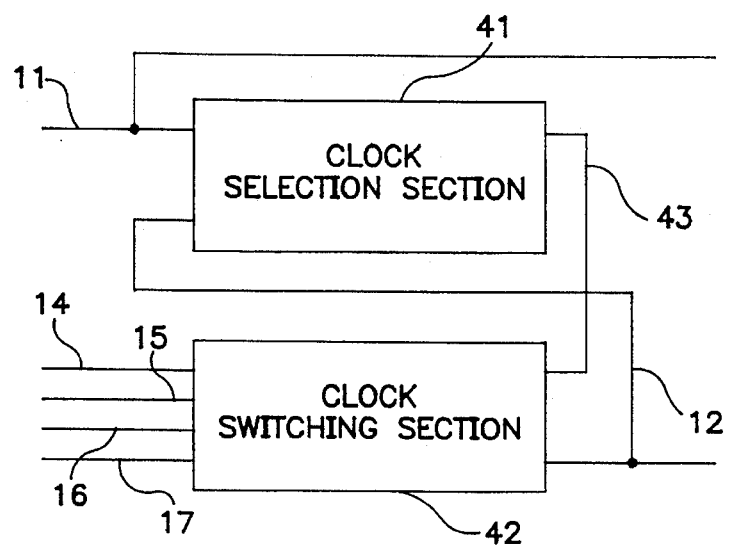
FIG. 15
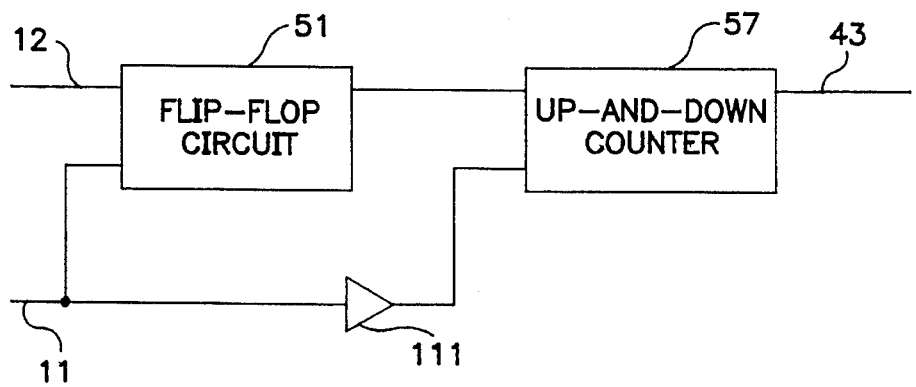
FIG. 16

CLOCK SIGNAL EXTRACTION APPARATUS USING VCO HAVING PLURALITY OF SELECTABLE PHASE SHIFTED OUTPUTS

BACKGROUND OF THE INVENTION

1. Field of the Invention

The present invention relates to a clock signal extraction apparatus for extracting a clock signal which determines the timing of received data signals. More particularly, the present invention relates to a clock signal extraction circuit for extracting a clock signal from burst data signals.

2. Description of Related Art

When digital signals are received, it is necessary to provide clock signals which determine the timing for receiving the data. Clock signals are sometimes transmitted from the data transmitter, in which case it becomes necessary to provide a separate path for transmitting the clock signals independently from the data signal. Therefore, extraction clock signals are usually generated by a phase locked loop (PLL) circuit.

The conventional PLL circuit has a voltage-controlled oscillator (VCO) which oscillates an extraction clock signal, a divider and a phase comparator which makes a phase comparison between the extraction clock signal and a data signal. The circuit also has a low-pass filter which generates a control voltage signal for the voltage-controlled oscillator from the output of the phase comparator. The voltage-controlled oscillator changes the frequency of the extraction clock signal in response to the voltage represented by the control voltage signal. The output of the voltage controlled oscillator, after being divided by the divider, is input to the phase comparator.

In cases where the data signal and the extraction clock signal divided therefrom exhibit a phase difference and different frequencies, the phase comparator detects this and outputs a control voltage signal. Both frequency and phase matching between the extraction clock signal and the data signal are achieved by repeatedly changing the oscillation frequency to minimize the phase difference at the time of the rise of the data signal.

In a conventional PLL circuit, once the frequency and phase of the extraction clock signal match those of the data signal, the matched state may be maintained almost indefinitely so long as data signals are successive. In cases where the data signals are burst data signals, however, the frequency and phase of the extraction clock signal must be matched to those of the data signal each time the data signal arrives. Here, "burst data signals" means data signals separated by intervening durations of no data signal.

When a period of no data signal changes to a data signal period, if the difference in phase and frequency is large between the extraction clock signal and the transmitted data signal, a rather prolonged time is required for their matching (pull-in time). Therefore, some leading data of the transmitted data signals may fail to be incorporated. Accordingly, it has been contemplated to add dummy data of a length which corresponds to the maximum pull-in time, to top off the data signals. This addition is, however, troublesome in that it causes poor transmission efficiencies because longer pull-in times require greater amounts of dummy data.

Therefore, there have been proposed a variety of processes for shortening the pull-in time when burst data signals are input. For example, Japanese Laid-Open Patent Appln. No. S63-296589 discloses the oscillation of a voltage-controlled oscillator at a frequency close to that of the burst data signals which are expected to arrive, prior to inputting the data signals. This technique allows the difference in frequency at the time of arrival of the data signals to be minimized, thereby shortening the pull-in time.

In addition, conventional PLL circuits operate first by converting the oscillation frequency of the voltage-controlled oscillator for phase matching and then by converting the frequency again for frequency matching with the data signals. Accordingly, even if the voltage-controlled oscillator was oscillating beforehand at a frequency close to that of the data signals, a relatively long time is needed for pulling in the phase lock. Japanese Laid-Open Patent Appln. No. H1-129530 suggests providing a phase shifter in the PLL circuit to sequentially shift the phase and frequency. This PLL circuit shifts only the phase in the beginning, and then, upon arrival of burst data signals, first performs a phase matching using the phase shifter and then performs a frequency matching using the voltage-controlled oscillator.

However, this process whereby a phase matching step using a phase shifter is followed by a frequency matching step using a voltage-controlled oscillator requires a complicated PLL circuit configuration. In addition, in cases where the frequencies are different, the phases deviate when the next data signal rises if only phase matching is performed at the beginning. Thus, the signal cannot be used any longer as the extraction clock signal. Moreover, the later frequency matching using a voltage-controlled oscillator causes deviation of the once-matched phases. In addition, time is necessary for both phase matching using a phase shifter and frequency matching using a voltage-controlled oscillator. This has caused the problem of prolonged pull-in time if the frequencies are different.

SUMMARY OF THE INVENTION

The object of the present invention is to match the extraction clock signal with the data signal in phase and frequency quickly after the data signal arrives.

A clock signal extraction apparatus according to the present invention has an oscillator which outputs a plurality of clock signals at an identical frequency but with different phases, and an oscillation frequency setting section. The oscillation frequency setting section sets the oscillation frequency of the oscillator to a predetermined value equivalent to the frequency of a clock component of the data signal. The clock signal extraction apparatus also has a selector and a switch. The selector functions to select a clock signal whose phase is closest to the phase of the data signal, from the plurality of clock signals output by the oscillator, each time the input data signal rises or falls. The switch switches from the preceding clock signal to the current clock signal, both selected by the selector, and outputs an extraction clock signal to determine the timing for incorporation of a value of the data signal.

More specifically, according to the present invention, a plurality of clock signals with different phases are oscillated by an oscillator to preset the oscillation frequency to the frequency of the data signal to be input. Since frequency matching with the data signal has been established in advance, the remaining requirement for obtaining an extraction clock signal to determine the timing for receiving the data signal is only phase matching. Even if the phase of the extraction clock signal has not been matched exactly with that of the data signal, the data signal may be received without an error. This is because it is only requisite that the timing for reception of the data be established within a sufficiently short period of the data signal. Therefore, of a plurality of clock signals having different phases, only the one whose phase is closest to the phase of the data signal is selected and output as the extraction clock signal. Moreover, since the one having the closest phase is selected each time the data signal rises or falls, an extraction clock signal having the properly corresponding phase may be provided even if the data signal jitters.

Another embodiment of the clock signal extraction apparatus according to the present invention has an oscillator which outputs a plurality of clock signals at an identical frequency but with different phases. The main difference from the above clock signal extraction circuit is that the oscillation frequency is variable. This clock signal extraction circuit has, in the same manner as the above circuit, a selector to select a clock signal whose phase is closest to the phase of the data signal. Also, this circuit has a switch to switch from a preceding clock signal to a current clock signal, both selected by the selector, and to output the latter clock signal as the extraction clock signal to determine the timing of the reception of the data signal. The clock signal extraction circuit particularly includes a phase comparator to compare the phase of any one of the clock signals output by the oscillator with that of the data signals and an oscillation frequency converter. The results of the comparison by the phase comparator are input to the oscillation frequency converter which converts the oscillation frequency of the oscillator so that the clock signal being compared with the data signal is matched with the latter in both phase and frequency.

More specifically, a comparison is made between the phase of the data signal and that of any one of the clock signals output by the oscillator, and the oscillator frequency is converted for their phase matching. Since this conversion makes the oscillator frequency approach the frequency of the data signal gradually, there is no need to match the oscillation frequency with the frequency of the data signal beforehand. In addition, the selection of the clock signal whose phase is closest to that of the data signal is made simultaneously with the conversion of the oscillator frequency. This simultaneous performance enables the phase and frequency matching between the extraction clock signal and the data signal to be accomplished in a short time. Additionally, the phase comparison with the data signal serves to establish an exact match with the data signal in oscillation frequency and phase.

A further clock signal extraction circuit has an oscillator which outputs a plurality of clock signals at an identical frequency but with different phases. This oscillation frequency is likewise also variable. The clock signal extraction circuit also has a selector which performs the same function as the selector used in the above circuit. The clock signal extraction circuit particularly includes a phase/frequency comparator to compare the phases and frequencies of the clock signal to which switching has been made by the switch and any one of the clock signals output by the oscillator. Also, this circuit includes an oscillation frequency converter to which the results of the comparison by the phase/frequency comparator are input and which converts the oscillation frequency of the oscillator. The phase and frequency of the clock signal under comparison by the comparator allows matching those of the clock signal switched to by the switch.

More specifically, a phase and frequency comparison is performed between the clock signal selected and any one of the clock signals output by the oscillator. The oscillation frequency of the oscillator is converted for phase and frequency matching. Since this conversion makes the oscillation frequency approach the frequency of the data signal gradually, there is no need to match the oscillation frequency with the frequency of the data signal beforehand. In addition, since the phase comparison with the selected clock signal has been completed, the phase comparison may be continued even in cases where, for example, a zero value of the data signal occurs successively. Furthermore, since the selection of the clock signal whose phase is closest to the phase of the data signal is made in parallel with the conversion of the oscillator frequency, the phase and frequency of the extraction clock signal may be substantially matched with those of the data signal in a short time.

In all of the embodiments of the clock signal extraction apparatus according to the present invention, the selector is capable of performing step-by-step phase changing of the selected clock signal to make the phase approach that of the data signal, each time the data signal rises or falls. Even in cases where the phase of the data signal changes greatly, an extraction clock signal having a relatively stable phase may be obtained by allowing the phase of the selected clock signal to change by only one step.

The phase difference of the plurality of clock signals oscillated by the oscillator can be identical. This enables the phase difference between the clock signal selected and the data signal to be smaller than a predetermined value.

BRIEF DESCRIPTION OF THE DRAWINGS

The above and other objects, features and advantages of the present invention will become more apparent from the following detailed description given with reference to the accompanying drawings wherein:

FIG. 5 is a timing diagram showing various waveforms of four clock signals output from the voltage-controlled oscillator of FIG. 2;

FIG. 8 is a schematic circuit diagram showing the circuit configuration of the first unit selection circuits shown in FIG. 7;

FIG. 9 is a timing diagram showing various waveforms of the respective signals upon switching between clock signals by unit selection circuits;

FIG. 10 is a block diagram showing the circuit configuration of the voltage-controlled oscillator of FIG. 2;

FIG. 11 is a timing diagram showing various waveforms of the respective signals upon matching of the oscillation frequency and phase of the voltage-controlled oscillator to those of the reference clock signal on initialization;

FIG. 12 is a timing diagram showing various waveforms of the respective signals upon changing from a non-data signal period to a data signal period;

FIG. 13 is a timing diagram showing various waveforms of the respective signals upon changing from a data signal period to a non-data signal period;

FIG. 15 is a block diagram showing the circuit configuration of the phase correction section in the FIG. 14 embodiment;

FIG. 16 is a schematic circuit diagram showing the circuit configuration of the clock selection apparatus in the FIG. 15 embodiment.

DETAILED DESCRIPTION OF THE PREFERRED EMBODIMENTS

Figure 1:
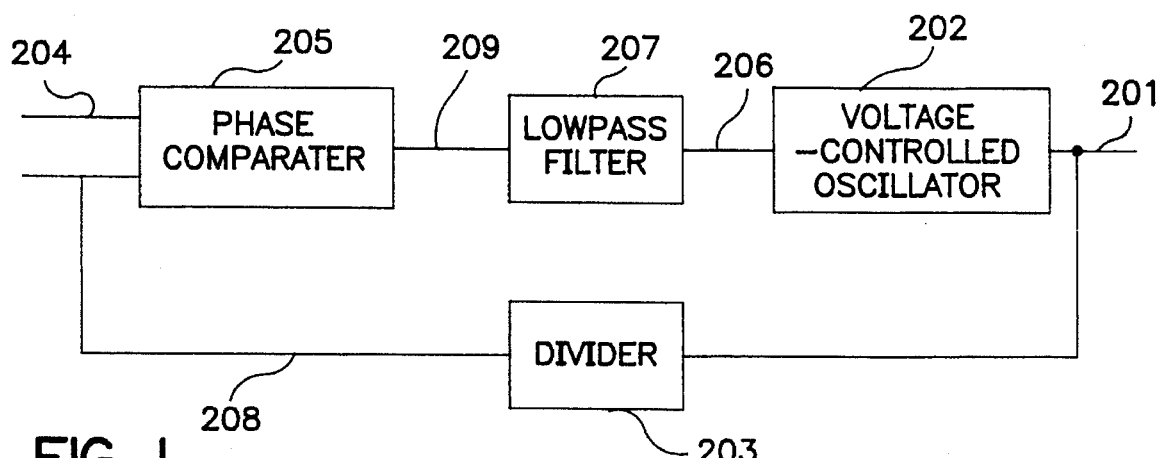
FIG. 1 is a block diagram showing the circuit configuration of a conventional PLL circuit.

To begin with, to more easily understand the present invention, a conventional PLL circuit will be described by referring to FIG. 1. FIG. 1 shows the configuration of the conventional PLL circuit.

The PLL circuit has a voltage-controlled oscillator (VCO) 202, which produces an extraction clock signal 201, a divider 203 and a phase comparator 205 which makes a phase comparison between the extraction clock signal 201 and a data signal 204. The circuit also has a low-pass filter 207 which generates a control voltage signal 206 for the voltage-controlled oscillator 202 from the output of the phase comparator 205. The voltage-controlled oscillator 202 controls the frequency of the extraction clock signal 201 which is output in response to the voltage represented by the control voltage signal 206. The output of the voltage-controlled oscillator 202, after being divided by the divider 203, is input to the phase comparator 205.

The phase comparator 205 compares the rising times of the data signal 204 and the clock signal 208 divided therefrom and outputs a phase error signal 209 which depends on the phase difference. The phase error signal 209 is a pulsed digital signal, and a larger phase difference gives a greater pulse width. The low-pass filter 207 extracts the low-frequency component of the phase error signal 209 and transforms it into a voltage signal.

In cases where the data signal 204 and the extraction clock signal 208 divided therefrom have a phase difference and different frequencies, the phase comparator 205 detects them and outputs a low-pass filtered control voltage signal 206. The voltage-controlled oscillator 202 controls the oscillation frequency in response to the voltage which is represented by the control voltage signal 206. Changing of the oscillation frequency is repeated to minimize the phase difference at the time of rising of the data signal 204. As a result, both frequency and phase matching is performed between the extraction clock signal 201 and the data signal 204.

The prior art PLL circuit might maintain a locked state almost indefinitely so long as the data signals are supplied, once the frequency and phase of the extraction clock signal match those of the data signal. However, in cases where the data signals are burst data signals as mentioned above, it is necessary to match the frequency and phase of the extraction clock signal to those of the data signal each time the data signal arrives. As a result, the prior art PLL circuit requires a long time to match both the phase and frequency.

Figure 2:
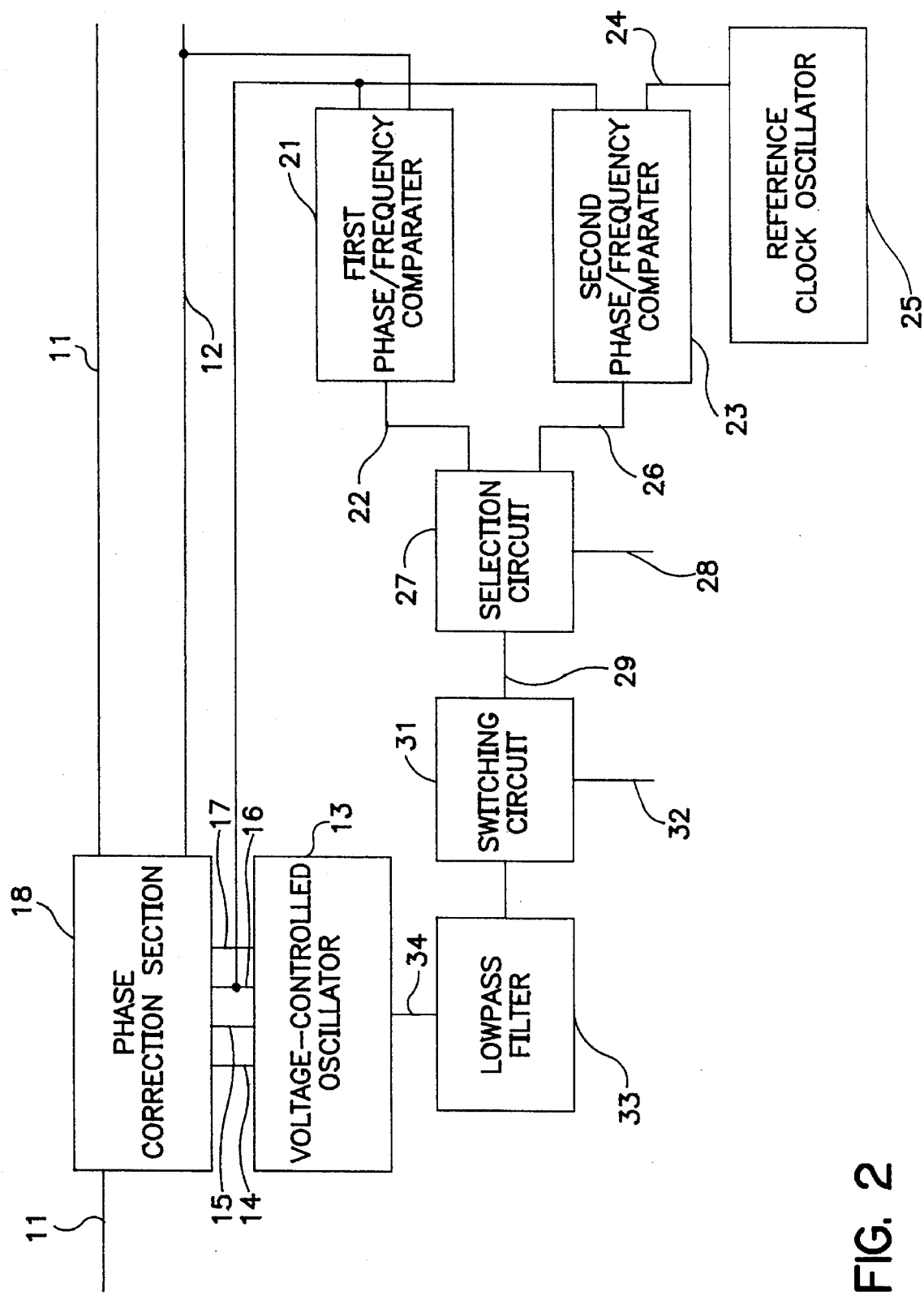
FIG. 2 is a block diagram showing a clock signal extraction apparatus according to an embodiment of the present invention.

The present invention solves the above problems and allows shost phase and frequency matching periods. FIG. 2 shows the configuration of a clock signal extraction apparatus according to an embodiment of the present invention. The PLL circuit, when a burst data signal 11 is input thereto, extracts an extraction clock signal 12 which is a clock signal to determine the timing for reception of the data signal. The voltage-controlled oscillator 13 outputs first through fourth clock signals 14–17 at an identical frequency but phase-shifted by 90° with respect to one another. The first through fourth clock signals 14–17 are input to a phase correction section 18. The burst data signal 11 is also input to this phase correction section 18. In turn, the phase correction section 18 outputs the burst data signal 11 and the extraction clock signal 12. The phase correction section 18 compares the phase of the burst data signal 11 with the phases of the first through fourth clock signals 14–17 input from the voltage-controlled oscillator 13. Then, the phase correction section 18 selects a clock signal having the least phase difference and outputs that clock signal as the extraction clock signal 12. Input to a first phase/frequency comparator 21 are the extraction clock signal 12 and, for example, the third clock signal 16. The first phase/frequency comparator 21 outputs a first phase error signal 22 depending on the phase difference and frequency difference between those signals.

The third clock signal 16 is also input to a second phase/frequency comparator 23. Meanwhile, a reference clock signal 24 at a frequency substantially equal to that of the burst data signal 11 is also input to the second phase/frequency comparator 23 from a reference clock oscillator 25. The second phase/frequency comparator 23 outputs a second phase error signal 26 which depends on the phase difference and frequency difference between those signals. Here, data signal 11 is a signal having a frequency of approximately 50 MHz. Since data signals may include jitters due to transit delay, some change in frequency occurs at the time of arrival at the receiving side. The reference clock signal 24 has a frequency of 50 MHz. The frequency of the reference clock signal 24 is allowed to deviate by approximately plus/minus 5% of 50 MHz. The error depends on the pull-in frequency range of the voltage-controlled oscillator. It is noted that the smaller the error of the frequency is, the shorter the pull-in time becomes. The first phase error signal 22 and the second phase error signal 26 are input to a selection circuit 27. The selection circuit 27 comprises an input control signal 28, based on which signal either the first phase error signal 22 or the second phase error signal 26 is selected and output.

The phase error signal 29 which is output from the selection circuit 27 is input to a switching circuit 31. A switching control signal 32 is input to the switching circuit 31. The switching control signal 32 is output from a data detection circuit (not shown). The data detection circuit is a circuit for determining whether the burst data signal 11 has arrived or not. It outputs the switching control signal 32 which sets the switching circuit 31 to "ON" only during the duration of the data signal 11. The output of the switching circuit 31 is input to a low-pass filter 33. The switching circuit 31 switches, based on the switching control signal 32, between inputting the phase error signal 29 from the selection circuit 27 into the low-pass filter 33 and not inputting the phase error signal 29 to the low-pass filter 33. The output of the low-pass filter 33 is input to the voltage-controlled oscillator 13 as the control voltage signal 34 which controls the oscillation frequency. The voltage-controlled oscillator 13 controls the oscillation frequency in response to the voltage of the control voltage signal 34.

The first and second phase/frequency comparators 21 and 23 are constructed by flip-flop circuits. These comparators 21 and 23 are set by the leading edge of one of the signals being input and reset by the leading edge of the other signal. With this system, the widths of the pulses output from the flip-flop circuits become smaller as the phase differences decrease, whereas the widths of the output pulses become greater as the phase differences increase. The phase differences thus may be extracted as pulse widths. The low-pass filter 33 outputs the control voltage signal 34 of voltage corresponding to the pulse width by extracting the low-frequency component of the phase error signal 29. In addition, since the phase error signal 29 is a pulsed binary signal, the selection circuit 27 is constructed by AND circuits, inversion circuits and OR circuits.

Figure 3:
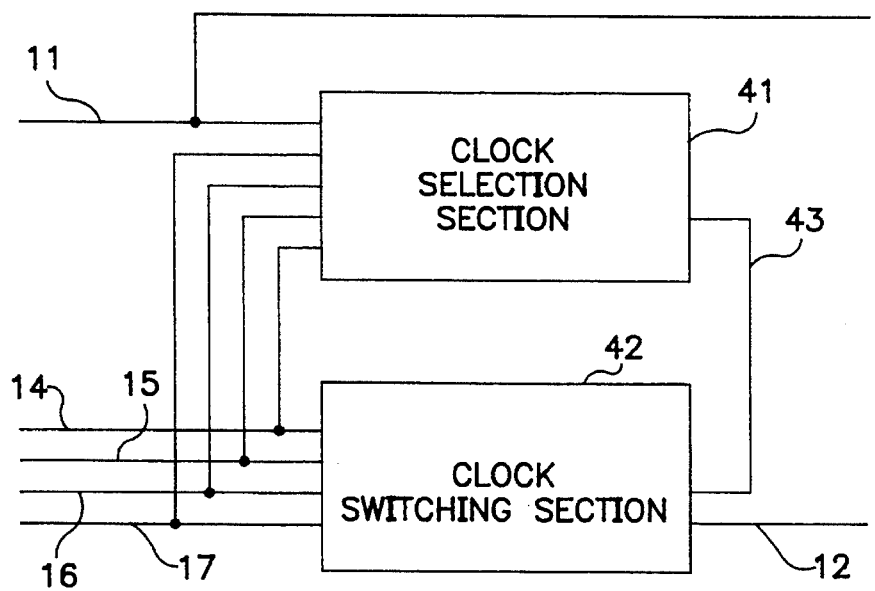
FIG. 3 is a block diagram showing the phase correction section of the clock signal extraction apparatus shown in FIG. 2.

FIG. 3 is an outline of the circuit of the phase correction section 18 shown in FIG. 2. The phase correction section comprises a clock selection section 41 that selects a clock signal whose phase is closest to the phase of the clock signal component of the data signal 11, and a clock switching section 42 that converts the phase-selected clock signal into the extraction clock signal 12. A burst data signal 11 is input to the clock selection section 41. Meanwhile, the first through fourth clock signals 14–17 are input from the voltage-controlled oscillator 13. A clock selection signal 43 is input to the clock switching section 42 from the clock selection section 41. The clock selection signal 43 is a 2-bit coded signal indicative of which of the first through fourth clock signals 14–17 is the selected clock signal. The first through fourth clock signals 14–17 are input to the clock switching section 42. The clock switching section 42 selects one of the first through fourth clock signals 14–17 on the basis of the clock selection signal 43 and outputs it as the extraction clock signal 12.

Figure 4:
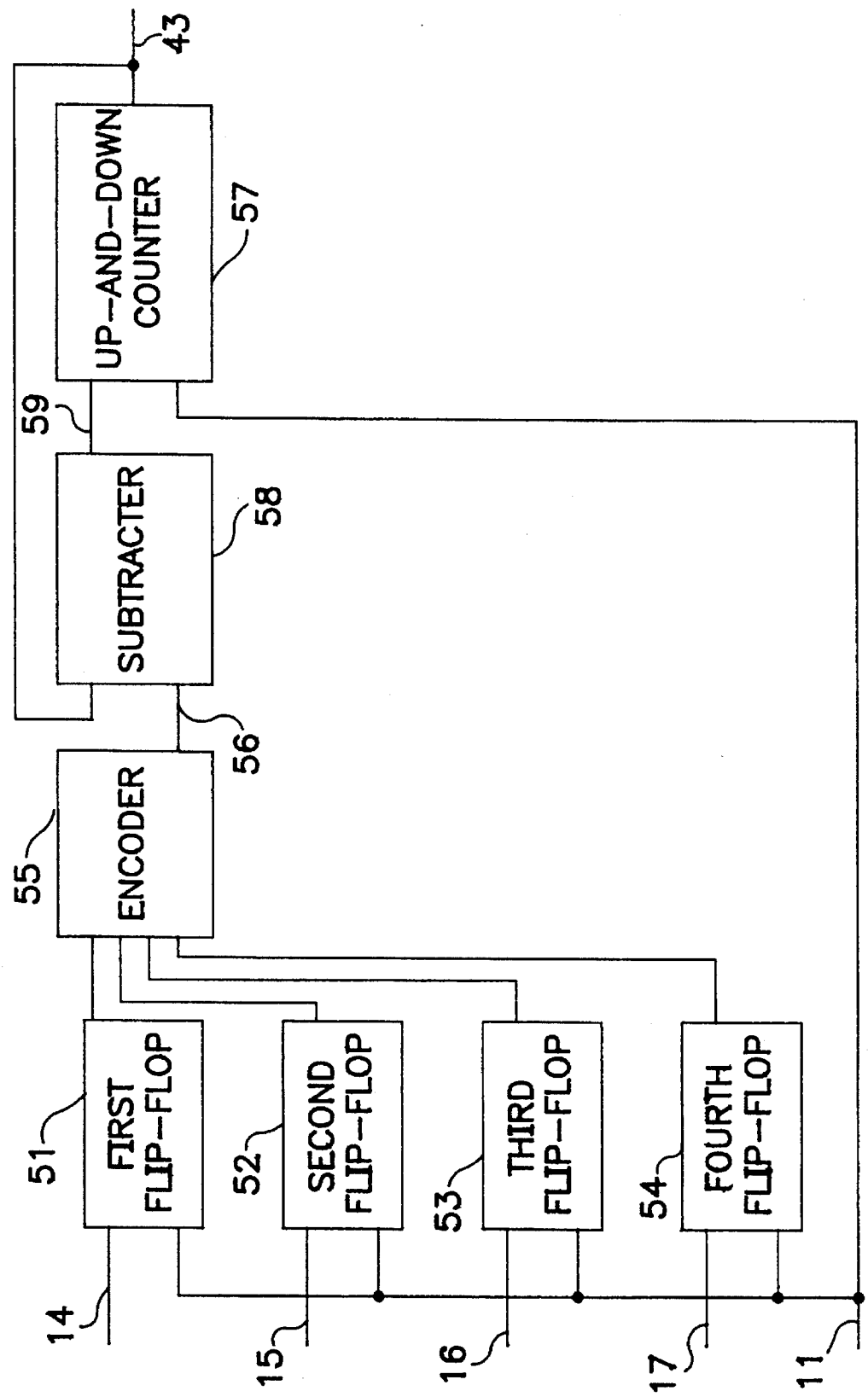
FIG. 4 is a block diagram showing the circuit configuration of the clock selection section of the phase correction section shown in FIG. 3.

FIG. 4 shows the circuit of the clock selection section shown in FIG. 3. The first through fourth clock signals 14–17 are input to corresponding first through fourth flip-flops 51–54 through the data terminals thereof. On the other hand, the burst data signal 11 is input to the series of flip-flop circuits via their clock terminals. The outputs of the first through fourth flip-flop circuits 51–54 are input to an encoder 55. The encoder 55 encodes the signals output from the first through fourth flip-flops 51–54 into 2-bit signals.

FIG. 5 illustrates the timing relationship between the rising of the data signal and the generation of the first through fourth clock signals. A high level signal is defined by "1", while "0" is defined as a low level signal. Since the first through fourth clock signals 14–17 are 90° out of phase with each other, the rising of the data signal 11 may be considered from four points of timing. It is possible to provide clock signals in a different number from the above, for example, six clock signals 60° out of phase with each other.

Thus, when the data signal 11 rises at time T11, the first clock signal 14 ((a) of FIG. 5) is a "1", whereas the second clock signal 15 ((b) of the same is a "0". On the other hand, the third clock signal 16 ((c) of the same) is a "0", and the fourth clock signal 17 ((d) of the same) is a "1". Accordingly, the result is "1001" when represented as 4-bit data. In the same manner, in the case of the data signal 11 rising at time T12, the data is represented as "1100", while the data is "0110" for time T13, and "0011" for time T14.

Figures 5A, 5B, 5C, 5D, 6:
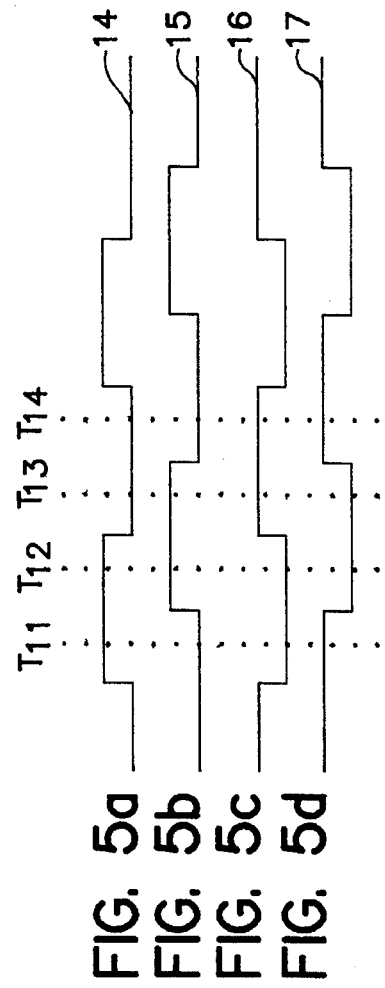
FIG. 6 is a listing of correspondences between the values to be encoded with the encoder of the clock selection apparatus and the respective clock signals.

FIG. 6 is a table providing a summary of the relationship between the output state of the flip-flop circuits shown in FIG. 4, data encoded therefrom and the clock signals. The leftmost column lists the timings T11–T14 of FIG. 5. The output states of the first through fourth flip-flops 51–54 shown in FIG. 4 at the respective timings are enumerated in the column to its right. The data after the first conversion is the result of setting only one bit each of the data to "1", corresponding to the four states. More specifically, the data after the first conversion has been prepared by detecting 2 successive bits of the 4 bits forming the data which contain "1" and "0" in that order and setting "1" only at the bit position which contains the "1".

Consequently, the "1001" is converted into "1000", and the "1100" is converted into "0100". In addition, the "0110" is converted into "0010", while the "0011" is converted into "0001". The third column from the left includes the value of the 2-bit encoded data of the fist conversion data. The rightmost column includes the clock signals which corresponds to the encoded data. The encoded data and the clock selection signals are both 2-bit signals. Their correspondence relationship with the first through fourth clock signals 14–17 is the same as shown in FIG. 6.

The following explanation refers again to FIG. 4. The encoded data 56 output from the encoder 55 and the 2-bit output from an up-down counter 57 are input to a subtracter 58. The subtracter 58 subtracts the encoded data 56 from the output of the up-down counter 57. The up-down control signal 59, which represents the most significant bit of the result of the subtraction, is input to the 2-bit up-down counter 57 through its up-down control signal input terminal. The data signal 11 is input to the up-down counter 57 through its clock input terminal. The up-down counter 57 performs counting upon rising of the data signal 11. Subtraction by one is done in cases where the value of the up-down control signal 59 is "0". Conversely, addition by one is done in cases where the value of the up-down control signal 59 is "1". In this way, the count changes by one each time data signal 11 rises, and there is output a 2-bit clock selection signal 43 which is the clock selection signal including the least phase difference from the data signal 11, of the first through fourth clock signals 14–17.

Figure 7:
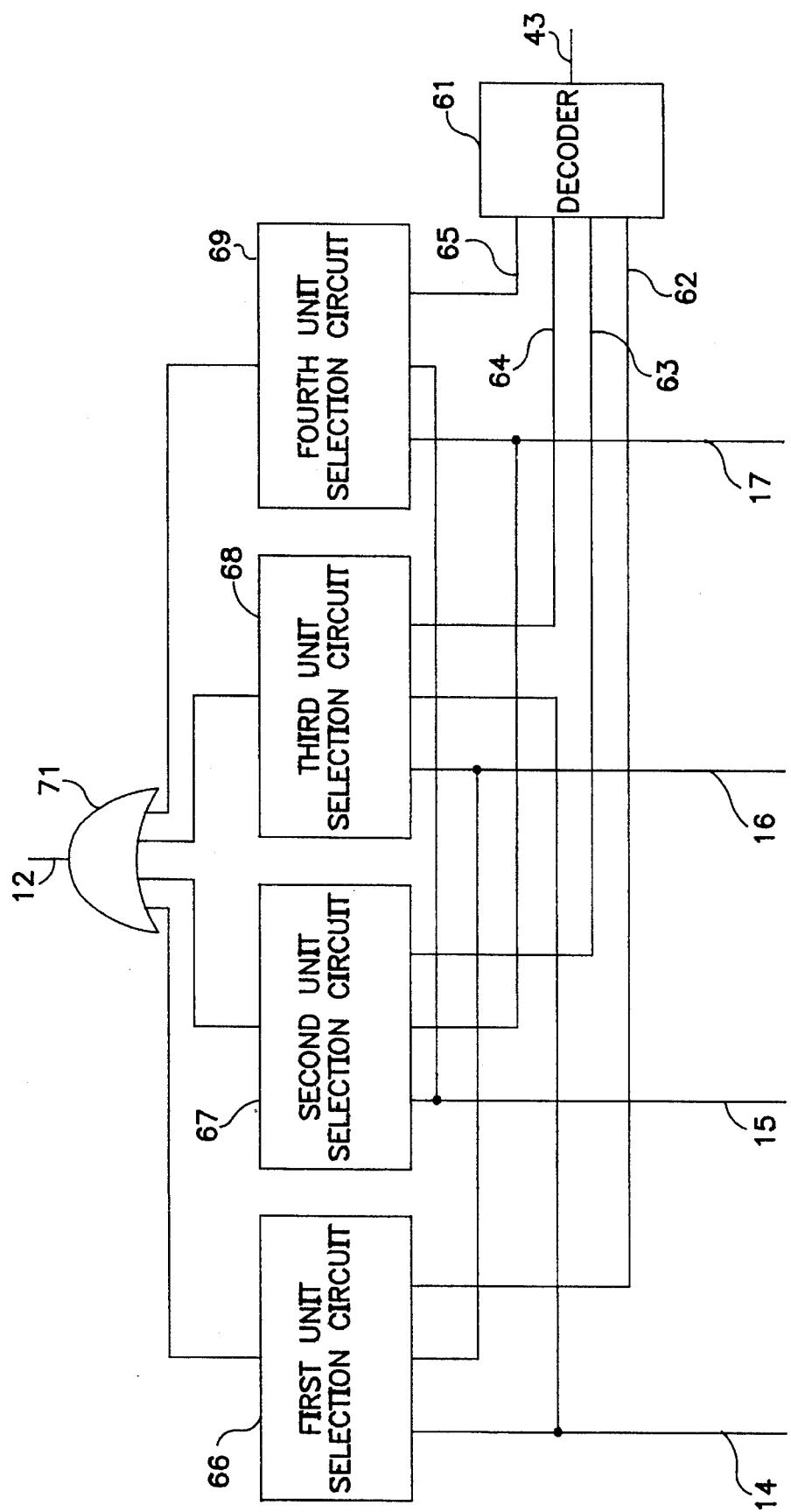
FIG. 7 is a block diagram showing the circuit configuration of the clock switching section shown in FIG. 2.

FIG. 7 shows the circuit of the clock switching section shown in FIG. 3. A clock selection signal 43 is input to a decoder 61. The decoder 61 decodes the 2-bit clock selection signal 43 into the first conversion values enumerated in FIG. 6 and outputs 4-bit selection data signals 62–65. One bit of each of the selection data signals 62–65 is input to first through fourth unit selection circuits 66–69, respectively. Meanwhile, clock signal 14 is input to the first unit selection circuit 66. This type signal will be referred to as a primary clock. The second clock signal 15 is input to the second unit selection circuit 67 as the primary clock. In the same manner, the third clock signal 16 as the primary clock is input to the third unit selection circuit 68, while a fourth clock signal 17 as the primary clock is input to the fourth unit selection circuit 69.

In the first through fourth unit selection circuits 66–69 there are input selection data signals which correspond to the bits whose data after the first conversion is a "1" when the clock signals shown in the rightmost column in FIG. 6 are input as the main clocks. Also, clock signals which are out of phase with the main clocks by 180° are input to the first through fourth unit selection circuits 66–69 as subclocks. That is, the third clock signal 16 is input to the first unit selection circuit 66 as the subclock. The fourth clock signal 17 is input to the second unit selection circuit 67 as the subclock. In the same manner, the first clock signal 14 and the second clock signal 15 are input to the third unit selection circuit 68 and the fourth unit selection circuit 69 respectively as the subclocks. The outputs of the first through fourth unit selection circuits 66–69 are input to an OR gate 71. The output of the OR gate is the extraction clock signal 12 which is output from the phase correction section 18 shown in FIG. 2.

FIG. 8 shows the circuit configuration of the unit selection circuits shown in FIG. 7. The first through fourth unit selection circuits have an identical configuration. A further explanation will be given with reference to the first unit selection circuit 66 as an example. A selection data signal 62 is input to a first flip-flop 81 and a second flip-flop 82 through their data input terminals. The first clock signal 14 is input to the first flip-flop 81 as the main clock. The third clock signal 16 is input to the second flip-flop 82 as the subclock. An OR gate 83 carries out the logical OR between the outputs of the first and second flip-flops 81 and 82. The first clock signal 14 as the main clock and the output of the OR circuit 83 are input to an AND gate 84 which carries out the logical AND between them. The output of the AND gate is the output of the first unit selection circuit 66.

When the selection data signal 62 changes from "1" to "0", the value of the output from the first flip-flop 81 changes from "1" to "0". The timing for the changing is set to the point in time shortly after the main clock 14 has risen. Accordingly, in cases where the AND gate 84 carries out the logical AND between the output of the first flip-flop 81 and the main clock 14, a whisker-like glitch noise is caused. Since the phase of the subclock 16 lags 180° behind the main clock 14, the second flip-flop 82 outputs "1"s until the subclock 16 rises. Conversely, if the OR gate 83 contributes to the logical AND performed at 84 between the output of OR gate 83 and the main clock 14, then no whisker-like glitch noise is caused. In other words, there may be secured a clock width which spans from the time of rising of the main clock 14 up to the time at which the value of the output of the second flip-flop 82 becomes a "0".

On the other hand, the clock selection section 41 of FIG. 3 selects clock signals which are out of phase with each other by one full phase. Suppose that the clock signal is switched from the first unit selection circuit 66 of FIG. 7 to the second unit selection circuit 67 in response to the clock selection signal 43. Under this condition, the output of the first unit selection circuit 66 becomes a "0" only when the subclock has risen. On the other hand, the output of the second unit selection circuit 67 changes from "0" into "1" when the main clock has risen. Although the main clocks and the counterpart subclocks are 180° out of phase with each other, the phase difference between the main clocks to the first unit selection circuit 66 and the second unit selection circuit 67 is 90°. Accordingly, the output of the second unit selection circuit 67 changes to "1" before the output of the first unit selection circuit 66 becomes a "0". Since the OR gate 71 of FIG. 7 carries out the logical OR between the output of the first unit selection circuit 66 and the output of the second unit selection circuit 67, the clock width is prolonged upon switching.

In this manner, the clock width at the time of switching of the extraction clock signal is prolonged in cases where a lag occurs in the phase of the clock signal to be changed. Thus, the phase of the extraction clock signal 12 may be delayed keeping pace with the data signal changed in the direction of the lagging of the phase. In cases where the phase of the clock to be changed advances, the duration of the "0" state is instead shortened, in pace with the advanced phase of the data signal 11. In addition, since the extraction clock signal 12 appears continuously over one cycle of the data signal 11, there is no risk of failure in incorporation of the data signal 11.

FIG. 9 shows waveforms at the respective sections in cases where the clock signal is switched by the clock switching section. The clock selection signal 43 ((*a*) and (*b*) of FIG. 9) changes from "10" to "01" at time T21. In other words, the extraction clock signal 12 ((*o*) of FIG. 9 is switched from the second clock signal 15 ((*h*) of FIG. 9) to the third clock signal 16 ((*i*) of FIG. 9). The selection data signals 62–64 ((*c*) through (*f*)) are signals decoded from the clock selection signal 43. The selection data signals 62–64 change from "0100" into "0010" at time T21 in response to the clock selection signal 43.

Consequently, until time T21 the output of the second unit selection circuit 67 ((*l*) of FIG. 9) dominates, whereas from time T21 the output of the third unit selection circuit 68 ((*m*) of FIG. 9) becomes dominant. In this case, the output of the first unit selection circuit 66 ((*k*) of FIG. 9) and the output of the fourth unit selection circuit clock signal 12 is the OR of these outputs, and the clock width is prolonged at time T21.

At time T22 the clock selection signal 43 changes again, and switching is made from the third clock signal 16 to the second clock signal 15. At this point in time the clock signal is switched in the direction of advancing of the phase. The output of the third unit selection circuit 68 changes into "0" at time T24 when the subclock signal 14 therefor ((*g*) of FIG. 9) rises. With regard to the second unit selection circuit 67, at time T23 when the subclock signal 17 therefor ((*j*) of FIG. 9) rises, the internal flip-flop circuit recognizes that the selection data signal 63 has become "1". However, due to carrying out the logical AND with the main clock 15, the output of the clock signal from the second unit selection circuit 67 starts at time T25. Accordingly, when the extraction clock signal 12 is switched from the third clock signal 16 to the second clock signal 15 the duration of the "0" state extends between time T24 and time T25. This change in duration of the clock width and the clock signal being "0" causes switching of the extraction clock signal to a clock signal including a phase which is closest to the phase of the data signal.

FIG. 10 shows the circuit configuration of the voltage-controlled oscillator shown in FIG. 2. Each of first and second delay inversion circuits 101 and 102 receives a control voltage signal 34 from the low-pass filter 33 of FIG. 2. The first and second delay inversion circuits 101 and 102 invert the input values and delay the input signals by a time which depends on the voltage of the control voltage signal 34, to produce an output. The first and second delay inversion circuits 101 and 102 are arranged in series. The output of the second delay inversion circuit 102, after having its value inverted, is input to the first delay inversion circuit 101. Oscillation is generated in this manner by looping the first and second delay inversion circuits 101 and 102 and the first inversion circuit 103. The oscillation frequency is determined by the delay times of the respective delay inversion circuits. Accordingly, a change in the delay times by the control voltage signal 34 may cause a change in the oscillation frequency of the voltage-controlled oscillator 13.

The clock signals output from the first delay inversion circuit 101 and the second delay inversion circuit 102 are input to the second and third inversion circuits 104 and 105, respectively. The phase of the clock signal output from the first delay inversion circuit 101 differs from the phase of the clock signal output from the second delay inversion circuit 102 by 90°. Consequently, these clock signals may be inverted through the second and third inversion circuits 104 and 105 to generate a clock signal which is 180° out of phase and clock signal which is 270° out of phase. In this manner, there can be generated the first through fourth clock signals 14–17 which are 90° out of phase with each other from the outputs of the first and second delay inversion circuits 101 and 102, and the outputs of the second and third inversion circuits 104 and 105.

To oscillate N (an integer of 2 or more) clock signals by dividing one cycle into N phases, N/2 delay inversion circuits are placed in series. The output of the last delay inversion circuit is inverted through an inversion circuit and input to the first delay inversion circuit. The clock signals output from these delay inversion circuits and clock signals which are generated by their inversion provide clock signals including N phases. The delay inversion circuits used are inversion circuits constructed by FETs (field effect transistors). Changing the bias voltages in the FETs causes changes in the time required by switching between the FETs. The delay times are varied by making use of this phenomenon.

With regard to the PLL circuit constructed as mentioned above, operations on initialization will be explained first. The initialization is carried out to oscillate the voltage-controlled oscillator 13 at a frequency which is close to the frequency of the burst data signal 11. The initialization allows shortening of the phase-pull-in time when the burst data signal 11 is input. In addition, in cases where the oscillation frequency of the voltage-controlled oscillator 13 differs too greatly from the frequency of the data signal 11, the frequency cannot be pulled in. The initialization may avoid the occurrence of this situation. On initialization, the switching circuit 31 and the selection circuit 27 are set such that the second phase error signal 26 output from the second phase/frequency comparator 23 is input to the low-pass filter 33. The low-pass filter 33 converts the second phase error signal 26 into the control voltage signal 34. The voltage-controlled oscillator 13 varies the oscillation frequency on the basis of the control voltage signal 34 which is input from the low-pass filter 33.

FIG. 11 shows the waveforms at the respective sections when the clock signal oscillated by the voltage-controlled oscillator is pulled into the reference clock signal with respect to frequency and phase on initialization. On initialization the switch control signal 32 ((a) of FIG. 11) brings the switching circuit 31 from an open-circuit state into a conduction state. Meanwhile, switching is made by the selection signal 28 ((b) of FIG. 11) so that the selection circuit 27 selects the second phase error signal 26. At time T31 when the initialization starts, the reference clock signal 24 ((c) of FIG. 11) and the third clock signal 16 ((d) of FIG. 11) oscillated by the voltage-controlled oscillator 13 have different phases and frequencies. The voltage-controlled oscillator 13 varies its frequency so that the phase difference from the reference clock signal 24 is eliminated. In this instance, at time T32 or the end of the fourth cycle of the third clock signal 16 after the start of initialization, the oscillation frequency and phase of the voltage-controlled oscillator 13 become identical to those of the reference clock signal 24. After having become identical, the switching circuit 31 is opened. The low-pass filter 33 maintains the voltage output immediately before the switching circuit 31 is opened. The initialization conducted in this manner allows a stable oscillation by the voltage-controlled oscillator 13 even before the inputting of the burst data signal 11.

Next, an explanation will be given regarding the operation of the PLL circuit when a data signal arrives.

FIG. 12 shows the waveform at the respective sections of the PLL circuit when the state in which no burst data signal has arrived changes to the state of a data signal having arrived. A data signal arrives at time T41. Suppose that the initialization has already been accomplished and oscillation by the voltage-controlled oscillator 13 has been conducted in a stable manner prior to the arrival of the data signal 11 ((a) of FIG. 12). Here, the switch control signal 32 ((b) of the same) is "OFF", and the switching circuit 31 is opened. Furthermore, except on initialization the selection circuit 27 selects the first phase error signal 22. The arrival of a burst data signal 11 is detected by a data detection circuit (not shown in FIG. 2), at which time (time T41) the switching circuit 31 changes into a state of conduction. Thereafter the oscillation frequency of the voltage controlled oscillator 13 is varied by the voltage-phase error signal 22. That is, the oscillation frequency is varied so that the phase difference between the third clock signal 16 ((e) of FIG. 12) and the extraction clock signal 12 output from the phase correction section 18 is eliminated.

Upon inputting of the burst data signal 11, the clock selection section 41 of FIG. 3 detects that clock signal which is the least out of phase with the data signal 11, of the first through fourth clock signals 14–17 ((c) through (f) in FIG. 12). To begin with, the value of the first through fourth clock signals at the time of rising of the data signal (time T41) are encoded into 2-bit encoded data by the encoder 55 of FIG. 4. At time T41 shown in FIG. 12, the second clock signal 15 has the least phase difference. Now, supposing that the third clock signal 16 is the current extraction clock signal 12 ((i) of FIG. 12), the value of the up-down counter 57 of FIG. 4 is incremented by 1 at the time of the next rising of the data signal 11 (time T42). In this manner the clock selection signal 43 ((g) and (h) in FIG. 12) which is output from the up-down counter 57 changes so that its value corresponds to the second clock signal 15. In other words, the value is "10" until time T42, whereas it is "01" between times T42 and T43. The clock switching section 42 of FIG. 3 performs switching for the extraction clock signal 12, in response to the clock selection signal 43. Here, until time T42 the third clock signal 16 is output as the extraction clock signal 12, while the second clock signal 15 is output from time T42 to time T43 instead.

The clock switching section 42 used in this embodiment of the present invention is adapted not to cause a glitch noise on switching for the extraction clock signal 12. On switching at time T42 shown in FIG. 12 the output extraction clock signal 12 is a combination of the third clock signal 16 and the second clock signal 15.

As mentioned above, the phase correction section 18 identifies a phase which is closest to the phase of the data signal 11, of the first through fourth clock signals 14–17 which are 90° out of phase with each other. Since the extraction clock signal 12 is a signal synchronized for enabling reception of the data signal 11, it is not necessary for it to be exactly in phase with the data signal during periods of a stable value of the data signal. Accordingly, even if the phase matching has not been established exactly, selection of a clock signal including the least phase difference of the four clock signals with four separate phases allows fail-safe reception of the data signal 11. Selection of the extraction clock signal which is least out of phase with the data signal 11 by the phase correction section 18 enables the extraction clock signal 12 which is consistent with the phase of the data signal 11, to be acquired in a short time.

On the other hand, the oscillation frequency of the voltage-controlled oscillator 13 is controlled so that the extraction clock signal 12 extracted by the phase correction section 12 and the third clock signal 16 have no phase difference. This control allows the oscillation frequency and phase of the third clock signal 16 to gradually approach those of the data signal 11. The actual time which is required for matching of the third clock signal 16 to the data signal 11 by the voltage-controlled oscillator 13 regarding phase and frequency does not differ form that required with the conventional PLL circuit shown in FIG. 1.

The point here, however, is that the phase correction section 18 selects the least phase-shifted one of the four clock signals as the extraction clock signal 12. In addition, the phase matching by the voltage-controlled oscillator is performed simultaneously. Therefore, the phase of the extraction clock signal 12 may approach the phase of the data signal 11 in a shorter time. In this way, even if the burst data signal 11 is greatly out of phase with the extraction clock signal 12 when input, an extraction clock signal in phase therewith may be acquired in a shorter time than with the conventional PLL circuit.

The following is an explanation of the operations of the PLL circuit when data signals no longer arrive.

FIG. 13 shows the waveforms at the respective sections when a burst data signal ends and a non-signal period begins. At time T51, the arrival of the data signal 11 ((a) of FIG. 13) ceases. This discontinuation is detected by the switch control signal 32 ((b) of FIG. 13) which in turn changes so as to open the switching circuit 31. Upon termination of the data signal 11, the phase correction section 18 no longer performs switching for the extraction clock signal 12. Then, the extraction clock signal 12 ((d) of FIG. 13) remains that selected immediately before time T51. The clock selection signal 43 ((c) of FIG. 13) changes so that the third clock signal is selected instead of the second clock signal in response to the last data signal, after which the third clock signal is maintained. Since the switching circuit 31 is kept open after time T51, the voltage of the control voltage signal 34 which is input to the voltage-controlled oscillator 13 is kept at a constant value by the low-pass filter 33. Accordingly, the oscillation frequency of the voltage-controlled oscillator 13 is maintained as well, thus providing a so-called free run state. In this manner, there is sufficient preparation for the arrival of the next data signal with only oscillation of the voltage-controlled oscillator 13 at the frequency established just before termination of the data signal 11.

The clock signal extraction circuit of the present invention may be modified in a variety of ways according to the intended application. Illustrative of such modifications are the following second through fourth embodiments, which will now be described.

Figure 14:
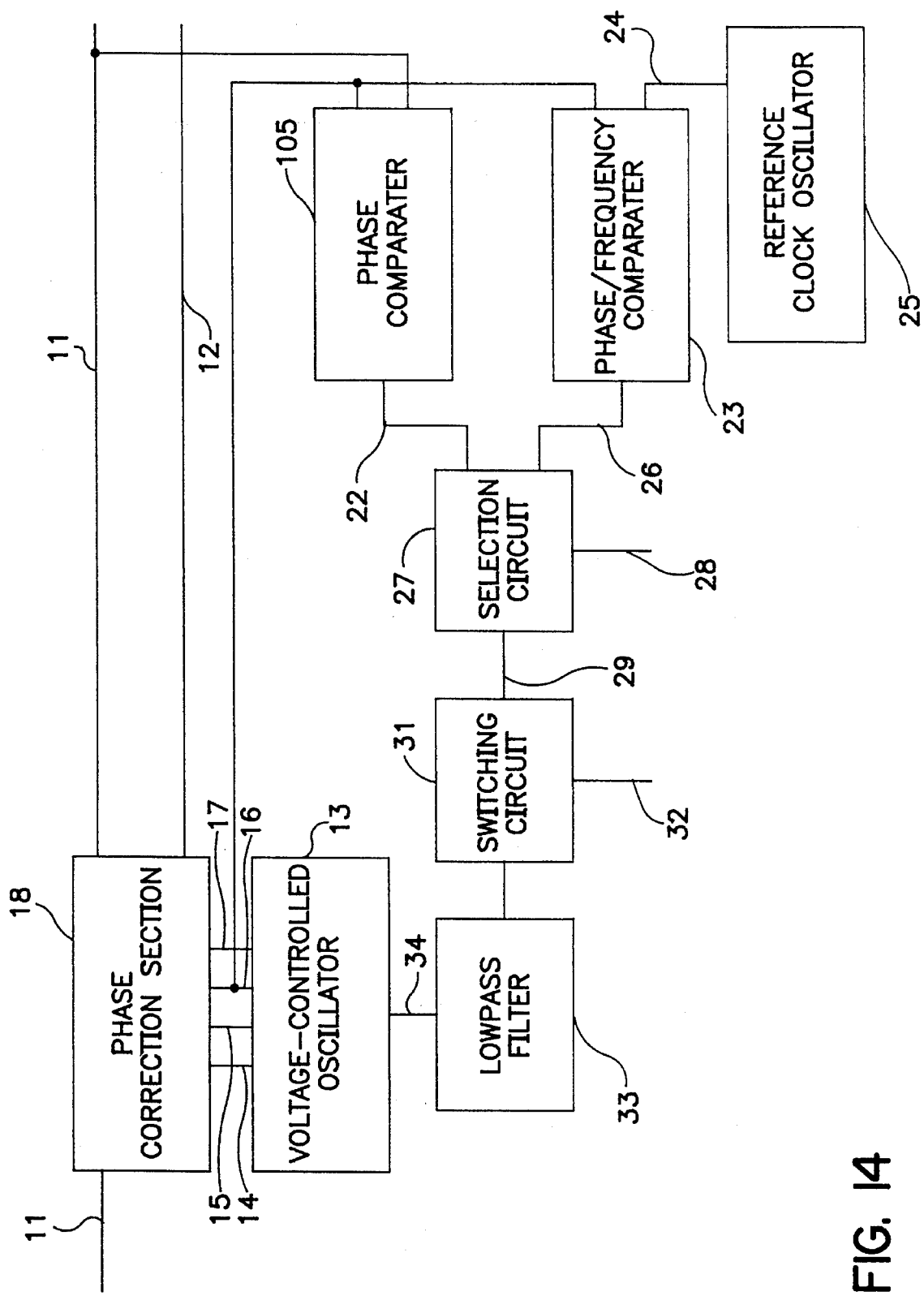
FIG. 14 is a block diagram showing the circuit configuration of the clock signal extraction apparatus according to a second embodiment of the present invention.

FIG. 14 shows the configuration of the clock signal extraction apparatus according to a second embodiment. Elements which are the same as those in the PLL circuit shown in FIG. 2 are denoted by like reference characters. According to the second embodiment, a phase comparator 105 is used instead of the first phase/frequency comparator 21 shown in FIG. 2. A data signal 11 output from a phase correction section 18 is input to the phase comparator 105. Therefore, the phase comparator 105 makes a comparison between, for example, a third clock signal 16 and the data signal 11, and outputs a first phase error signal 22. The phase comparator 105 makes a phase comparison at the time of rising or falling of the data signal 11. For example, during times when the data signal remains continuously "1" or "0", the value of the data signal 11 remains unchanged during that period. For this reason the phase comparison cannot be made during that period, and occasionally much time may be required for matching the third clock signal 16 oscillated by the voltage-controlled oscillator 13 to the data signal 11 with respect to phase and frequency.

When the data signal 11 has been scrambled, however, neither the "0" nor "1" state will persist beyond a given time period. Here, the phase comparison with the data signal according to the second embodiment accomplishes the matching of the phase and frequency of the control signal which is oscillated by the voltage-controlled oscillator to those of the data signal with a higher degree of accuracy than with the PLL circuit shown in FIG. 2.

Next, a third embodiment characterized by modification of the phase comparison section will be described. FIG. 15 shows the layout of the phase correction section in this third embodiment. Elements which are the same as those in FIG. 2 are denoted by like reference characters. In this embodiment, the first through fourth clock signals 14–17 are not input to the clock selection section 41, but rather the extraction clock signal 12 is input thereto instead.

FIG. 16 shows the layout of the clock selection section 41 shown in FIG. 15. The extraction clock signal 12 is input to a flip-flop circuit 51 via its data input terminal. The data signal 11 is input to the flip-flop circuit 51 through its clock terminal. The output of the flip-flop circuit 51 is input to an up-down counter 57 through its up-down switching signal input terminal. The data signal 11 is delayed by a buffer 111 slightly longer than the delay time imparted by the flip-flop circuit 51. The delayed data signal 11 input to the up-down counter varies by just one depending on whether signal 12 output from the clock switching section 42 of FIG. 15 changes phase-by-phase, and eventually an extraction clock signal 12 whose phase is closest to the phase of the data signal 11 is acquired.

Although the configuration of the clock selection section 41 is simplified according to the third embodiment, the comparison is made with the extraction clock signal 12 after switching has been done by the clock switching section 42. On the contrary, the phase comparison between the data signal 11 and the first through fourth clock signals is not made directly. Switching is performed on extraction clock signal 12 which undergoes phase comparison with the data signal 11, on the basis of the results of the comparison at the time of rising of the preceding data signal 11. Accordingly, if the value of the up-down counter is varied at the time of rising of the next data signal 11 on the basis of the phase comparison in the same manner as with the clock selection section 41 shown in FIG. 3, the phase of the extraction clock signal 12 differs more greatly from the phase of the data signal 11.

The data of the data signal 11 would be actually received in sync with the extraction clock signal 12 at some later time than the time of phase comparison. For this reason, there may be cases where the extraction clock signal 12 is greatly out of phase with the data signal 11 which is actually being received. Accordingly, the buffer 111 slightly delays the data signal 11 so that the value of the flip-flop circuit 51 is immediately reflected by the up-down counter 57. This allows correlation of the data signal 11 being received with the extraction clock signal 12 upon timed reception of the data signal 11.

Figure 17:
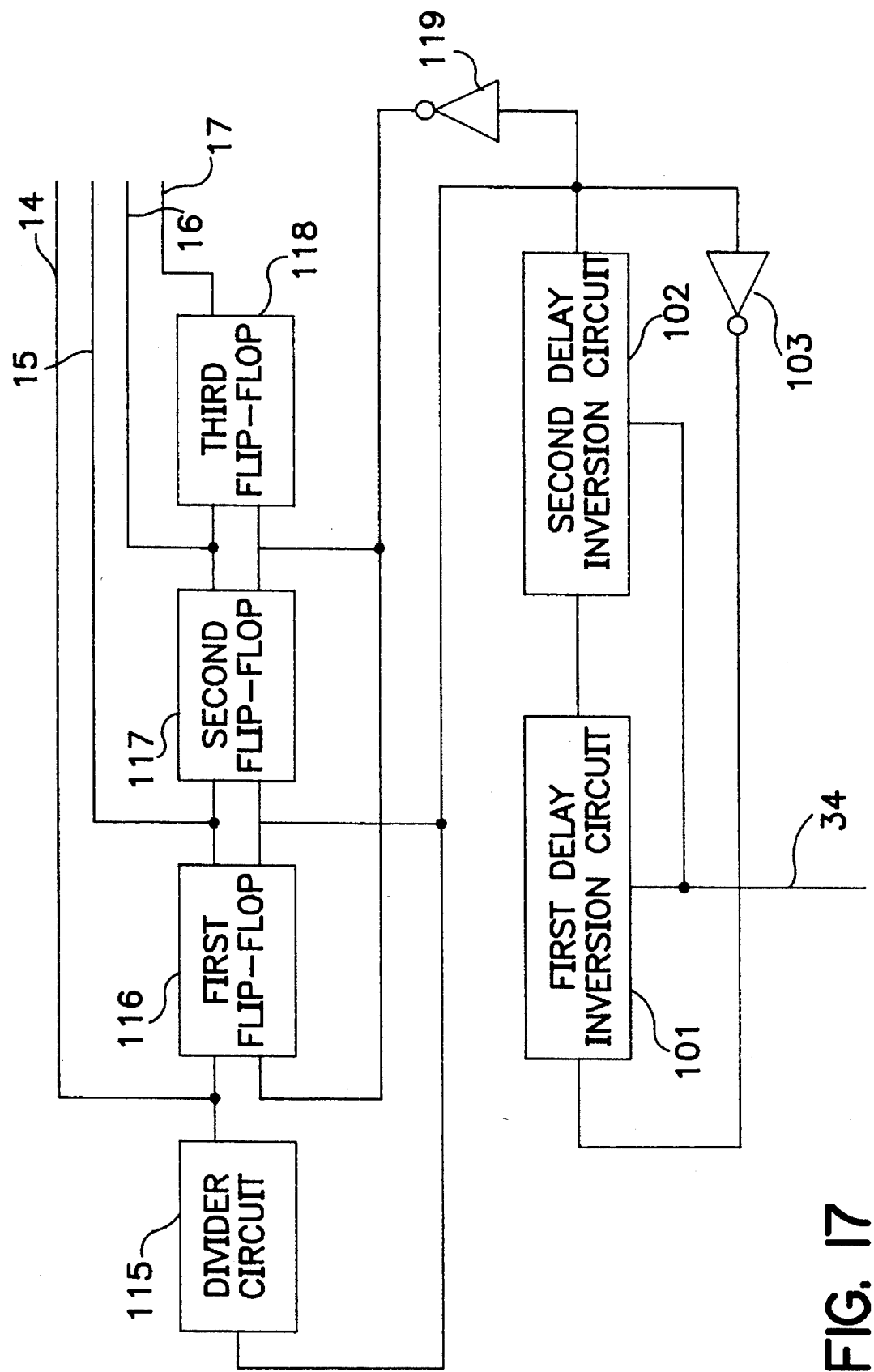
FIG. 17 is a block diagram showing the circuit configuration of another embodiment of the voltage-controlled oscillator.

FIG. 17 shows the voltage-controlled oscillator according to a fourth embodiment of the present invention. Elements which are the same as those of FIG. 10 are denoted by like reference characters. In this fourth embodiment, the delay inversion circuits oscillate the clock signals at twice the frequency of the first through fourth clock signals 14–17 output from the voltage-controlled oscillator 13. The output of the second delay inversion circuit 102 is input to a divider circuit 115 by which the frequency is divided by half. The output of the divider circuit 115 is input to a first flip-flop 116 through its data input terminal. The output of the first flip-flop 116 is input to a second flip-flop 117 via its data input terminal, while the output of the second flip-flop 117 is input to a third flip-flop 118. The output of second delay inversion circuit 102 is also input to the second flip-flop 117 through its clock terminal. The output of the second delay inversion circuit 102 is further input to an inversion circuit 119.

The clock signal, having been inverted by the inversion circuit 119, is then input to the first flip-flop 116 and the third flip-flop 118 through their clock terminals. The divided clock signal undergoes 90° phase shifts in the process of its shifting through the first through fourth flip-flops 116–118. Consequently, the output of the divider circuit 115 and the outputs of the first through third flip-flop 116–118 may provide four clocks which are 90° out of phase with each other. The phase differences between the respective resulting phases can be matched because a signal is oscillated at a high frequency, divided and then phase shifted by the flip-flop circuits. In other words, the different delay times provided by the delay inversion circuits due to their intrinsic differences result in no separate phase differences between the respective phases. In order to generate clock signals with N (an integer of 2 or more) phases, however, oscillation at a frequency N/2 times the number of clock signals would be required. This requirement causes a lowered maximum frequency of the clock signal which is output from the voltage-controlled oscillator as compared with the case of the circuit shown in FIG. 10.

According to the first and third embodiments explained above, the phase correction section changes the extraction clock signal by one phase each time the data signal rises. Data signals often involve jitters, and thus the duration of one cycle of a data signal is not constant. In cases where the timing for rising of the data signal changes greatly due to the occurrence of a jitter, the phase of the extraction clock may in turn be changed by two or more phases all at once. However, the data signal is received in synchronization with the extraction clock signal one or two signals later than the data signal which has been used for selection of the extraction clock signal. Therefore, in most cases jitter is reduced and the time is less for achieving synchronized reception of the data signal. Accordingly, when the extraction clock signal is changed simultaneously by two or more phases, a data signal may be received whose value is in an unstable state since it is being changed to the next value.

For this reason the phase correction section changes the data signal only by one phase at a time. This phase-by-phase change of the clock signal nevertheless enables effective reception of burst data signals. For example, the clock signals may be almost in phase, at the latest, at the rising of the fourth-arriving data signal. The phase-by-phase changing does not fail to recognize the data signal because a dummy signal is usually added to the top of the data signal to facilitate phase matching.

In addition, although clock signals with four phases are oscillated by the voltage-controlled oscillator in the above embodiments, the number of phases is not limited to four; the clock signals may have, for example, eight or sixteen phases, and the phase difference between the data signal and the extraction clock may be minimized accordingly. This, however, results in an increase in the required circuitry to acquire an extraction clock signal which is least out of phase with the arriving burst data signal. Eight phases have proven to be suitable in practice. Furthermore, the phase differences between the respective phases may be unequal. In addition, the clock signal to be input to the first phase/frequency comparator or the second phase/frequency comparator is not limited to the third clock signal, and may have any phase. It is further noted that the subclocks to be input to the unit selection circuits do not need to be 90° out of phase with the counterpart main clocks. For example, in the case of using clock signals with eight phases, main clocks and their counterpart subclocks may be 90° or otherwise out of phase with each other.

According to the clock signal extraction circuit of the present invention mentioned above, the extraction clock signal can be acquired shortly after the input of the data signal, because the only requirement is to select that one of a plurality of clock signals whose phase is closest to the phase of the data signal. Therefore, the time for phase matching can be reduced, and the amount of dummy data to be added to the top of the data signal can be decreased, thereby increasing transmission efficiency. In addition, selection is made of a clock signal with the closest phase each time the data signal rises or falls. Therefore, an extraction clock signal including the properly corresponding phase can be provided even if the phase of the data signal is altered because of the occurrence of jitters.

Also, according to another circuit presented by the second embodiment of the present invention, a comparison is made between the phase of the data signal and that of any one of the clock signals output by an oscillator. The oscillator frequency is converted for their phase matching. Since this conversion makes the oscillator frequency approach the frequency of the data signal gradually, there is no need to match the oscillation frequency with the frequency of the data signal beforehand. Thus, the invention can be applied to data signals at various frequencies. In addition, selection of that clock signal whose phase is closest to that of the data signal is made at the same time with the conversion of the oscillator frequency. This simultaneous processing makes it possible to match the phase and frequency of the extraction clock signal to those of the data signal in a short time. Additionally, the phase comparison with the data signal serves to establish an exact match with the data signal in oscillation frequency and phase.

Moreover, it is possible with the present invention to make a phase and frequency comparison between the selected clock signal and any one of the clock signals output by an oscillator. Then, the oscillation frequency of the oscillator is converted for phase and frequency matching. This conversion makes the oscillator frequency approach the frequency of the data signal gradually. Therefore, there is no need to match the oscillation frequency with the frequency of the data signal beforehand. Also, the present invention can be applied to data signals at various frequencies. In addition, the phase comparison can be continued even in cases where, for example, a "0" value of the data signal occurs uninterruptedly, because the phase comparison with the selected clock signal has been completed. Further, since the selection of the clock signal whose phase is closest to the phase of the data signal is made at the same time as switching among the clock signals, the extraction clock signal can be substantially matched with the data signal in a shorter time.

Also, the phase of the extraction clock signal to be selected changes step by step. This stepwise changing prevents sudden changes in the phase of the extraction clock signal even with brief large changes in the phase of the data signal. For example, there may be cases where a data signal which arrives later than the one subjected to the phase comparison is received while synchronizing with the selected clock signal selected; this usually means that the phase difference has become smaller at the time of acquisition than at the time of phase comparison. Accordingly, the step-by-step change of the phase to be selected allows the phase difference to become, rather, smaller at the time of acquisition of the data.

The phase differences of the plurality of clock signals output by the oscillator are preferably identical. This enables the phase difference between the clock signal selected and the data signal to be desirably small.

While this invention has been described in connection with several preferred embodiments, it is to be understood that the subject matter encompassed by this invention is not to be limited to those specific embodiments. On the contrary, it is intended that the invention include all alternatives, modifications and equivalents as can be included within the spirit and scope of the following claims.

We claim:

1. A clock signal extraction apparatus, comprising:

an oscillator outputting clock signals at a common frequency but with N different phases, wherein N is an integer of at least 2;

setting means for setting the oscillation frequency of said oscillator to a predetermined value which is equivalent to the frequency of a clock component of an incoming data signal;

selection means for selecting and outputting one of said clock signals whose phase is closest to the phase of said incoming data signal, each time said incoming data signal rises or falls; and switching means for switching from a preceding clock signal to a current clock signal, both selected by said selection means, and for outputting an extraction clock signal to determine a timing for acquisition of said data signal.

2. The clock signal extraction apparatus claimed in claim 1, wherein said selection means includes means for changing the phase of the clock signal stepwise each time the data signal rises or falls, thereby to cause the phase of the clock signal to approach that of the data signal.

3. The clock signal extraction apparatus claimed in claim 1, wherein said N different phases have identical phase differences therebetween.

4. The clock signal extraction apparatus claimed in claim 1, wherein said switching means comprises (a) clock selection means for selecting that clock signal whose phase is closest to the phase of the clock signal component of said data signal and outputting a clock selection signal; and (b) clock switching means for selecting and outputting a clock signal for said data signal in response to the clock selection signal.

5. The clock signal extraction apparatus claimed in claim 4, wherein said clock selection means comprises:

N flip-flops receiving respective ones of said clock signals selected from said clock signals with N phases and said data signal, said flip-flops outputting a predetermined code which depends on the clock signals and the state of said data signal;

an encoder which selects a code output from said flip-flops and converts it into encoded output data;

a subtracter which subtracts said encoded data from the clock selection signal and outputs an up-down control signal; and an up-down counter which increments or decrements said clock selection signal in response to said up-down control signal and outputs the incremented or decremented signal as a fresh clock selection signal.

6. The clock signal extraction apparatus claimed in claim 4, wherein said clock switching means comprises:

a decoder which decodes said clock selection signals for correspondences with said clock signals and outputs N selection data signals;

N unit selection circuits receiving a main clock signal corresponding to either of the clock signals with N phases and at least one subclock signal which selects and outputs either one on the basis of said selection data signal; and an OR circuit which receives said clock signals output from said unit selection circuits and outputs the logical OR thereof.

7. The clock signal extraction apparatus claimed in claim 6, wherein each of said unit selection circuits comprises:

a main flip-flop receiving said selection data signal and said main clock signal, wherein output therefrom of said main clock signal is controlled by said selection data signal;

at least one secondary flip-flop receiving said selection data signal and said subclock signal, wherein output therefrom of said subclock signal is controlled by said selection data signal;

an OR circuit which outputs the logical OR of the clock signals output from said main flip-flop and said secondary flip-flop; and an AND circuit which outputs the logical AND between the output of said OR circuit and said main clock signal.

8. The clock signal extraction apparatus claimed in claim 3, wherein said oscillator comprises:

N/2 delay inversion circuits, placed in series so as to form a loop, each receiving a control voltage signal and inverting an input signal and delaying said input signal by a time corresponding to a voltage determined by said control voltage signal; and an inversion circuit which is incorporated in said loop and inverts the value of the input signal when the number of said delay inversion circuits is even;

wherein the respective delayed and inverted signals output from said N/2 delay inversion circuits are divided into halves, and one half is output directly, whereas the other half is output after being inverted.

9. A clock signal extraction apparatus comprising:

an oscillator outputting clock signals at a common frequency but with N different phases, where N is an integer of at least 2, and wherein the oscillation frequency is variable;

selection means for selecting that one of said clock signals whose phase is closest to a phase of an incoming data signal, each time said incoming data signal rises or falls;

switching means for switching from a preceding clock signal to a current clock signal, both selected by said selection means, and outputting an extraction clock signal to determine a timing for reception of said data signal;

phase comparison means for comparing the phase of any one of said clock signals with the phase of said incoming data signal; and oscillation frequency converter means for receiving the results of the comparison by said phase comparison means and for converting the oscillation frequency of said oscillator so that the clock signal under comparison with said data signal is matched with the latter in phase and frequency.

10. The clock signal extraction apparatus claimed in claim 9,
wherein said selection means includes means for changing the phase of the clock signal stepwise each time the data signal rises or falls, thereby to cause the phase of the clock signal to approach that of the data signal.

11. The clock signal extraction apparatus claimed in claim 9,
wherein said N different phases have identical phase differences therebetween.

12. The clock signal extraction apparatus claimed in claim 9,
wherein said switching means comprises (a) clock selection means for selecting that clock signal whose phase is closest to the phase of the clock signal component of said data signal and outputting a clock selection signal; and (b) clock switching means for selecting and outputting a clock signal for said data signal in response to the clock selection signal.

13. The clock signal extraction apparatus claimed in claim 12, wherein said clock selection means comprises:
N flip-flops receiving respective ones of said clock signals selected from said clock signals with N phases and said data signal, said flip-flops outputting a predetermined code which depends on the clock signals and the state of said data signal;
an encoder which selects a code output from said flip-flops and converts it into encoded output data;
a subtracter which subtracts said encoded data from the clock selection signal and outputs an up-down control signal; and
an up-down counter which increments or decrements said clock selection signal in response to said up-down control signal and outputs the incremented or decremented signal as a fresh clock selection signal.

14. The clock signal extraction apparatus claimed in claim 12, wherein said clock switching means comprises:
a decoder which decodes said clock selection signals for correspondences with said clock signals and outputs N selection data signals;
N unit selection circuits receiving a main clock signal corresponding to either of the clock signals with N phases and at least one subclock signal which selects and outputs either one on the basis of said selection data signal; and
an OR circuit which receives said clock signals output from said unit selection circuits and outputs the logical OR thereof.

15. The clock signal extraction apparatus claimed in claim 14, wherein each of said unit selection circuits comprises:
a main flip-flop receiving said selection data signal and said main clock signal, wherein output therefrom of said main clock signal is controlled by said selection data signal;
at least one secondary flip-flop receiving said selection data signal and said subclock signal, wherein output therefrom of said subclock signal is controlled by said selection data signal;
an OR circuit which outputs the logical OR of the clock signals output from said main flip-flop and said secondary flip-flop; and an AND circuit which outputs the logical AND between the output of said OR circuit and said main clock signal.

16. The clock signal extraction apparatus claimed in claim 11, wherein said oscillator comprises:
N/2 delay inversion circuits, placed in series so as to form a loop, each receiving a control voltage signal and inverting an input signal and delaying said input signal by a time corresponding to a voltage determined by said control voltage signal; and
an inversion circuit which is incorporated in said loop and inverts the value of the input signal when the number of said delay inversion circuits is even;
wherein the respective delayed and inverted signals output from said N/2 delay inversion circuits are divided into halves, and one half is output directly, whereas the other half is output after being inverted.

17. A clock signal extraction apparatus, comprising:
an oscillator which outputs clock signals at an identical frequency but with N difference phases, wherein N is an integer of at least 2, and wherein the oscillation frequency is variable;
selection means for selecting that one of said clock signals whose phase is closest to the phase of an incoming data signal, each time said incoming data signal rises or falls;
switching means for switching from a preceding clock signal to a current clock signal, both selected by said selection means, and outputting an extraction clock signal to determine a timing for receiving said data signal;
phase/frequency comparison means for comparing the phases and frequencies of a clock signal switched to by the switching means and any one of said clock signals output by said oscillator; and
oscillation frequency converter means receiving the results of the comparison by said phase/frequency comparison means and converting the oscillation frequency of said oscillator so that the phase and frequency of the clock signal under comparison match the phase and frequency of the clock signal switched to by said switching means.

18. The clock signal extraction apparatus claimed in claim 17,
wherein said selection means includes means for changing the phase of the clock signal stepwise each time the data signal rises or falls, thereby to cause the phase of the clock signal to approach that of the data signal.

19. The clock signal extraction apparatus claimed in claim 17,
wherein said N different phases have identical phase differences therebetween.

20. The clock signal extraction apparatus claimed in claim 17,
wherein said switching means comprises (a) clock selection means for selecting that clock signal whose phase is closest to the phase of the clock signal component of said data signal and outputting a clock selection signal; and (b) clock switching means for selecting and outputting a clock signal for said data signal in response to the clock selection signal.

21. The clock signal extraction apparatus claimed in claim 20, wherein said clock selection means comprises:
N flip-flops receiving respective ones of said clock signals selected from said clock signals with N phases and said data signal, said flip-flops outputting a predetermined code which depends on the clock signals and the state of said data signal;

an encoder which selects a code output from said flip-flops and converts it into encoded output data;

a subtracter which subtracts said encoded data from the clock selection signal and outputs an up-down control signal; and an up-down counter which increments or decrements said clock selection signal in response to said up-down control signal and outputs the incremented or decremented signal as a fresh clock selection signal.

22. The clock signal extraction apparatus claimed in claim 20, wherein said clock switching means comprises:

a decoder which decodes said clock selection signals for correspondences with said clock signals and outputs N selection data signals;

N unit selection circuits receiving a main clock signal corresponding to either of the clock signals with N phases and at least one subclock signal which selects and outputs either one on the basis of said selection data signal; and an OR circuit which receives said clock signals output from said unit selection circuits and outputs the logical OR thereof.

23. The clock signal extraction apparatus claimed in claim 20, wherein each of said unit selection circuits comprises:

a main flip-flop receiving said selection data signal and said main clock signal, wherein output therefrom of said main clock signal is controlled by said selection data signal;

at least one secondary flip-flop receiving said selection data signal and said subclock signal, wherein output therefrom of said subclock signal is controlled by said selection data signal;

an OR circuit which outputs the logical OR of the clock signals output from said main flip-flop and said secondary flip-flop; and an AND circuit which outputs the logical AND between the output of said OR circuit and said main clock signal.

24. The clock signal extraction apparatus claimed in claim 20, wherein said oscillator comprises:

N/2 delay inversion circuits, placed in series so as to form a loop, each receiving a control voltage signal and inverting an input signal and delaying said input signal by a time corresponding to a voltage determined by said control voltage signal; and an inversion circuit which is incorporated in said loop and inverts the value of the input signal when the number of said delay inversion circuits is even;

wherein the respective delayed and inverted signals output from said N/2 delay inversion circuits are divided into halves, and one half is output directly, whereas the other half is output after being inverted.

* * * * *